(12) United States Patent
Franz et al.

(10) Patent No.: US 7,817,417 B2
(45) Date of Patent: Oct. 19, 2010

(54) FLEXIBLE AIRFLOW BAFFLE FOR AN ELECTRONIC SYSTEM

(75) Inventors: John P Franz, Houston, TX (US); Richard A. Bargerhuff, Spring, TX (US); David A. Selvidge, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/253,781

(22) Filed: Oct. 17, 2008

(65) Prior Publication Data

US 2010/0097758 A1   Apr. 22, 2010

(51) Int. Cl.
G06F 1/20 (2006.01)
H05K 7/20 (2006.01)

(52) U.S. Cl. ............... 361/679.51; 361/679.49; 361/679.5; 361/690; 361/716; 361/721; 454/184

(58) Field of Classification Search ............ 361/679.46, 361/679.48–679.51, 690, 694–695, 716, 361/721; 165/80.3; 312/223.2, 236; 454/184
See application file for complete search history.

(56) References Cited

U.S. PATENT DOCUMENTS

| | | | |
|---|---|---|---|
| 6,220,887 B1 * | 4/2001 | Downs ................ 439/377 |
| 6,483,699 B1 | 11/2002 | Salmonson et al. |
| 7,262,964 B1 * | 8/2007 | Barsun ................ 361/695 |
| 7,542,289 B2 * | 6/2009 | Tsai et al. ............ 361/695 |
| 7,589,973 B2 * | 9/2009 | Ong et al. ............ 361/719 |
| 7,663,875 B2 * | 2/2010 | Lee et al. ............ 361/679.46 |
| 2008/0101004 A1 | 5/2008 | Chen |
| 2008/0117589 A1 | 5/2008 | Carrera et al. |
| 2009/0027852 A1 * | 1/2009 | Roesner et al. ........ 361/690 |
| 2009/0233537 A1 * | 9/2009 | Kao et al. ............ 454/184 |
| 2010/0002372 A1 * | 1/2010 | Lee et al. ............ 361/679.46 |
| 2010/0020487 A1 | 1/2010 | Lee et al. |
| 2010/0105313 A1 * | 4/2010 | Tsai et al. ............ 454/284 |
| 2010/0130120 A1 * | 5/2010 | Lee et al. ............ 454/284 |

FOREIGN PATENT DOCUMENTS

DE   102005063024 A1 *   7/2007

* cited by examiner

*Primary Examiner*—Jayprakash N Gandhi
*Assistant Examiner*—Robert J Hoffberg

(57) ABSTRACT

A baffle manages airflow through optionally mounted electronic components by using flexible members formed to extend to empty connectors and flex away from the connectors to accommodate electronic components mounted to the connectors.

16 Claims, 9 Drawing Sheets

FLEXIBLE AIRFLOW BAFFLE FOR AN ELECTRONIC SYSTEM

BACKGROUND

The difficulty in managing cooling in computer systems, servers, and electronic systems is increased as the systems evolve to more compact but higher power conditions, extending beyond simple cooling of processors to other components including memory devices. For example, memory power is increasing in systems and, when combined with an increasing number of memory sockets, thermal concerns arise when systems are configured with less than full populated memory. The concerns arise from two fundamental physical processes. First, sufficient airflow for cooling hot memory in populated sockets is bypassed when air can flow through neighboring empty memory socket channels. Second, air bypassing through empty memory bank channels creates lower pressure drop for the system. In an aggregate cooling architecture, the change in pressure drop can "steal" air from neighboring systems or components within the blade and thus cause thermal problems in various distributed areas. The thermal problems cause the fans to speed up to compensate for heating, thus using more energy and creating additional noise.

Typically, thermal and pressure drop concerns are addressed by dedicating internal fans to selected parts of the system, allowing airflow bypass for hot areas that are controlled by zones of fans that operate independently. Such a thermal control system results in less than optimal fan use, higher power usage and noise levels, and generally is sufficient only for lower power memory and stand-alone rack and tower systems.

Another thermal management technique involves insertion of "dummy" memory sticks or plastic blank partitions to fill voids, a costly solution resulting in waste since the sticks or partitions are generally discarded during upgrade. Furthermore, the technique is not thermally reliable due to lack of implementation control since the manufacturer or user may not populate the empty slots.

SUMMARY

Embodiments of a baffle manage airflow through optionally mounted electronic components by using flexible members formed to extend to empty connectors and flex away from the connectors to accommodate electronic components mounted to the connectors.

BRIEF DESCRIPTION OF THE DRAWINGS

Embodiments of the invention relating to both structure and method of operation may best be understood by referring to the following description and accompanying drawings.

DETAILED DESCRIPTION

Embodiments of electronic and computer systems or servers include a low-profile, low-cost automatic memory baffle flow balancer.

The illustrative baffles use independent, thin flexible structures to automatically accommodate different electronic component or memory bank array population configurations. Balanced air flow through the components or memory bank and constant system pressure drop are maintained by either filling in the air channels when no memory is installed or deflecting away when memory is populated to enable cooling of memory and other system components.

In a system including memory devices, the illustrative baffle system is arranged to correspond to the memory banks and automatically fills voids created by empty memory module (for example dual in-line memory module (DIMM) slots). By filling the voids, airflow is maintained in balance through memory bank to prevent overheating. Filling the voids also maintains pressure drop through the system and prevents overheating on neighboring systems for products with aggregate cooling.

Figure 1A:
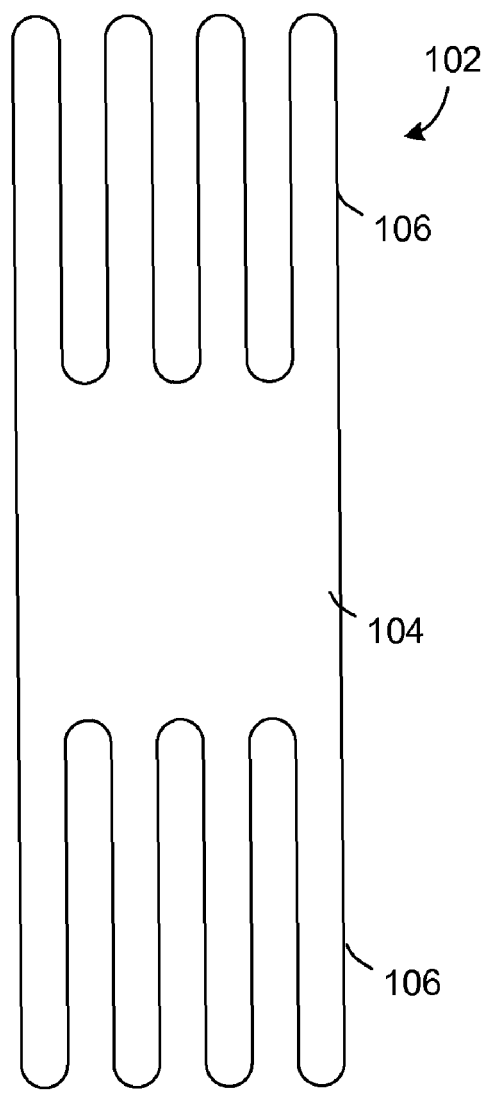
FIGS. 1A and 1B are schematic pictorial diagrams showing overhead and side views of an embodiment of a baffle that manages airflow through optionally mounted electronic components in an electronic assembly.
Figure 1B:
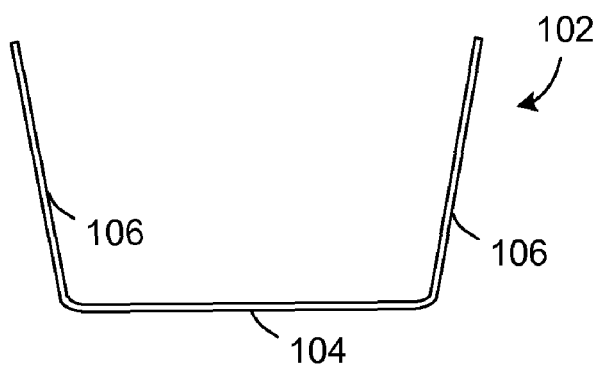

Referring to FIGS. 1A through 1D, schematic pictorial diagrams show various embodiments and aspects of a baffle 102 that manages airflow through optionally mounted electronic components 110 by using flexible members 106 formed to extend to empty connectors 112 and flex away from the connectors 112 to accommodate electronic components 110 mounted to the connectors 112. FIGS. 1A and 1B show overhead and side views of an embodiment of the baffle 102.

Figure 1C:
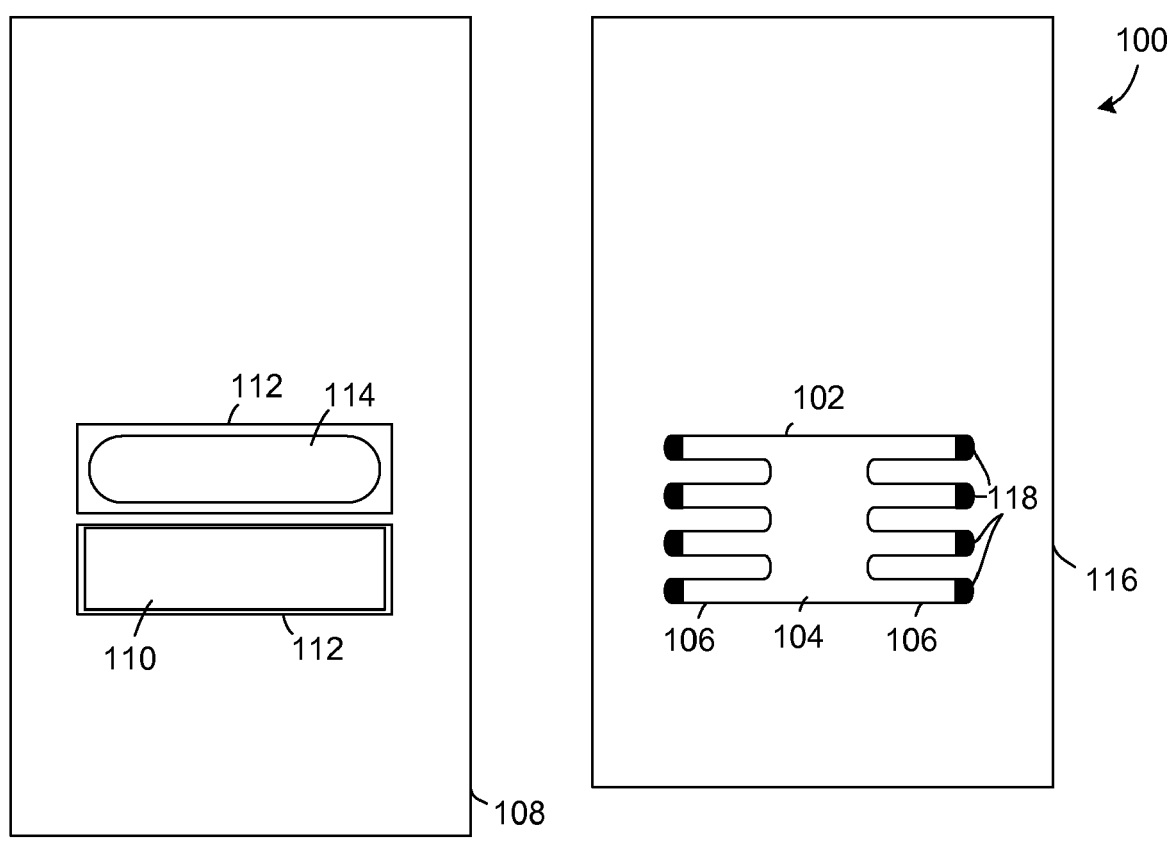
FIGS. 1C and 1D are overhead and side views depicting an embodiment of the electronic assembly.
Figure 1D:
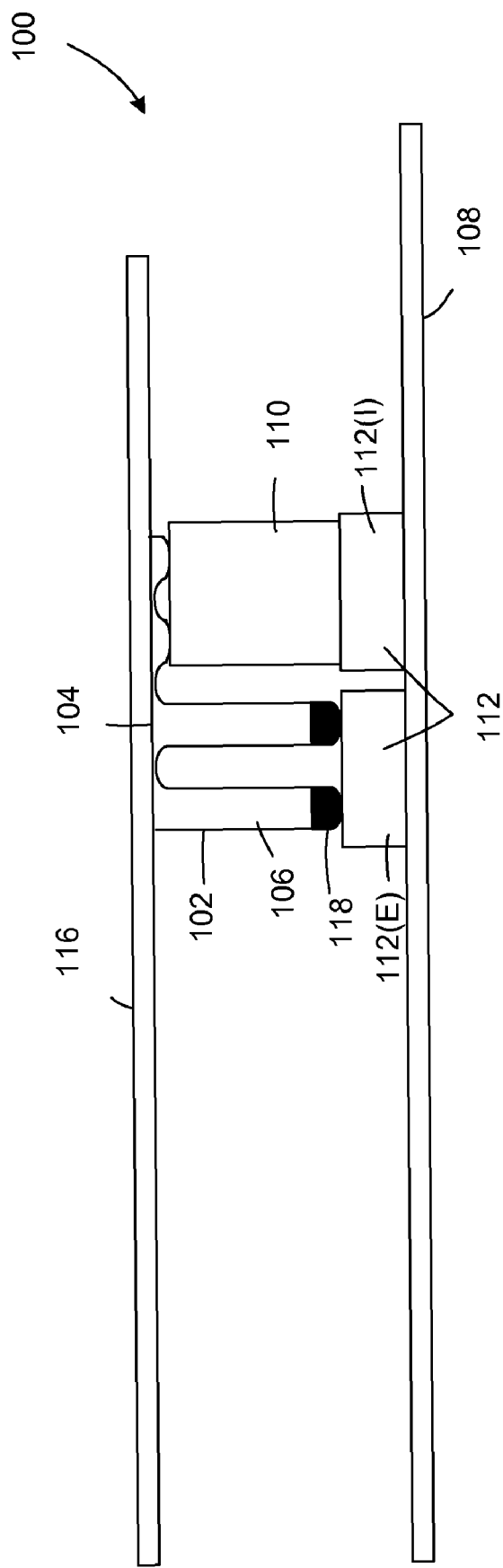

The baffle 102 can be used to manage airflow in an electronic assembly 100. FIGS. 1C and 1D are overhead and side views depicting an embodiment of the electronic assembly 100. The overhead view of FIG. 1C shows a circuit board 108 and inverted cover plate 116 alongside one another. In an example embodiment, the electronic assembly 100 can comprise multiple connectors 112 which are operative as multiple mounting means for optionally mounting electronic components 110, and the baffle 102 which is operative as an airflow management means for managing airflow through the optionally mounted electronic components 110. The baffle 102 has flexible members 106 which are formed to extend downward to empty connectors 112 and sufficiently flexible to flex upward away from the connectors 112 to accommodate electronic components 110 mounted to the connectors 112. The electronic components 110 thus are interposed between the connectors 112 and the baffle 102, thereby pushing or flexing the flexible members 106 away from the connectors 112.

In some embodiments, the electronic assembly 100 can further comprise a circuit board 108 and multiple electronic connectors 112 mounted to the circuit board 108. The electronic connectors 112 have a slot 114 that accepts an electronic component 110 for mounting. The electronic assembly 100 further comprises a cover plate that closes opposite the circuit board 108. For example, for a circuit board 108 arranged to extend in a horizontal plane and connectors 112 and components 110 mounted on top of the circuit board 108, the cover plate 116 can close either downward or slide horizontally over the circuit board 108. In other arrangements, the circuit board 108 and cover plate 116 can extend in approximately vertical planes, or any suitable configuration. The electronic assembly 100 further comprises the baffle 102 that couples to the cover plate 116 opposite the plurality of electronic connectors 112. The baffle 102 comprising a baffle plate 104 coupled to a plurality of flexible appendage members 106 which extend lateral to the baffle plate 104 and are formed to extend to contact empty electronic connectors 112 and are suitably flexible to flex away from the connectors 112 to contact edges of electronic components 110 which are installed in the electronic connectors 112.

In some arrangements of the baffle 102, the baffle plate 104 can be formed with the appendage members 106 on multiple sides. The arrangement of appendage members 106 can be symmetric or asymmetric. In other arrangements, the appendage members 106 can be positioned on a single side of the baffle plate 104. The baffle plate 104 can be arranged in any suitable geometry, for example rectangular, square, circular, or any geometry.

In one example of a suitable arrangement, the baffle 102 can be constructed as a metal plate and a plurality of metal appendage members extending from the metal plate. For example, the baffle 102 can be formed as a thin metal plate and metal appendage members of thickness less than approximately 0.25 millimeters.

An insulative material 118 can be used to coat at least one surface of the metal plate and the metal appendage members.

The baffle 102 can be formed using any suitable technique. For example, the baffle 102 can be constructed by forming a flexible metal sheet into the metal plate and the multiple metal appendage members which are integral to the metal plate by cutting or stamping of the metal sheet.

The baffle 102 can also be constructed from suitable materials other than metal. For example, the baffle 102, including the baffle plate 104 and appendage members 106 can be formed from flexible plastic, or other material.

Referring to FIG. 1D, the flexible appendage members 106 can be arranged so that multiple members 106 oppose a single electronic connector slot 114 and are arranged to manage airflow resistance so that the multiple members 106 fill a void when an electronic connector 112(E) is empty. The members 106 extend down to the empty electronic connector 112(E), thereby creating the airflow resistance. For electronic connectors 112(I) in which electronic components 110 are installed, the multiple members 106 are deflected by the installed electronic component 110, enabling airflow around the electronic component 110.

The baffle 102 can be formed to prevent airflow between the cover plate 116 and electronic components 110 installed in the electronic connector slots 114.

The baffle 102 can be configured for automatic installation so that seating of the cover plate 116 automatically positions the baffle 102 in correspondence with the electronic connectors 112 and electronic components 110.

The baffle 102 can be configured as a single integral sheet wherein the appendage members 104 are connected to the baffle plate 102 without hinges or connection hardware.

The baffle 102 can be configured with substantially zero clearance above electronic components or devices.

The illustrative baffle system is superior to installation of spring-loaded flaps on structures around the memory since such flaps involve multiple parts and much assembly, both of which are expensive. The spring-loaded flaps also occupy a substantial amount of space to implement and thus cannot be implemented in compact systems.

Figure 2A:
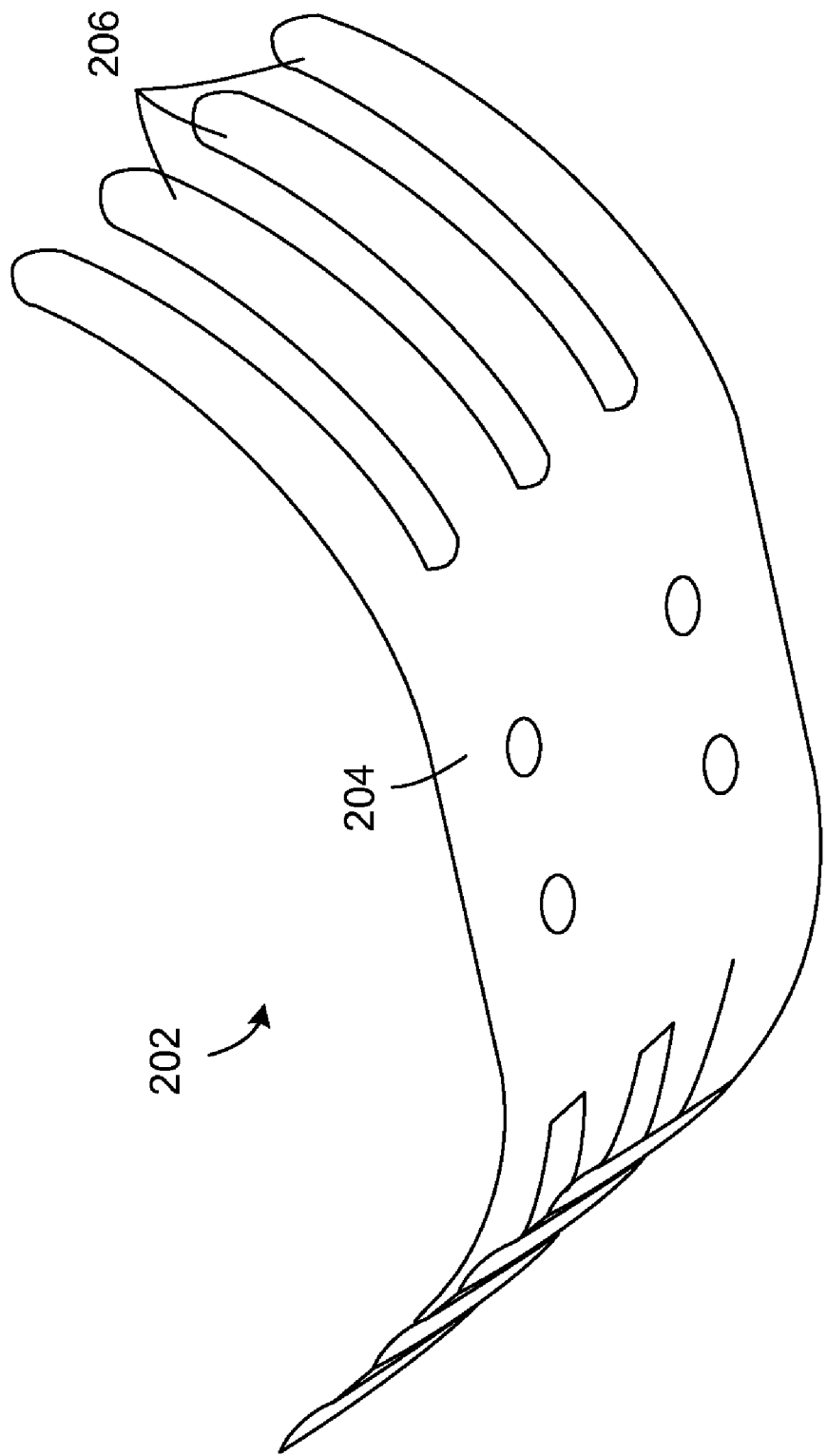
FIGS. 2A and 2B are pictorial diagrams showing an embodiment of baffle in curved and flattened arrangements for usage in a computer system.
Figure 2B:
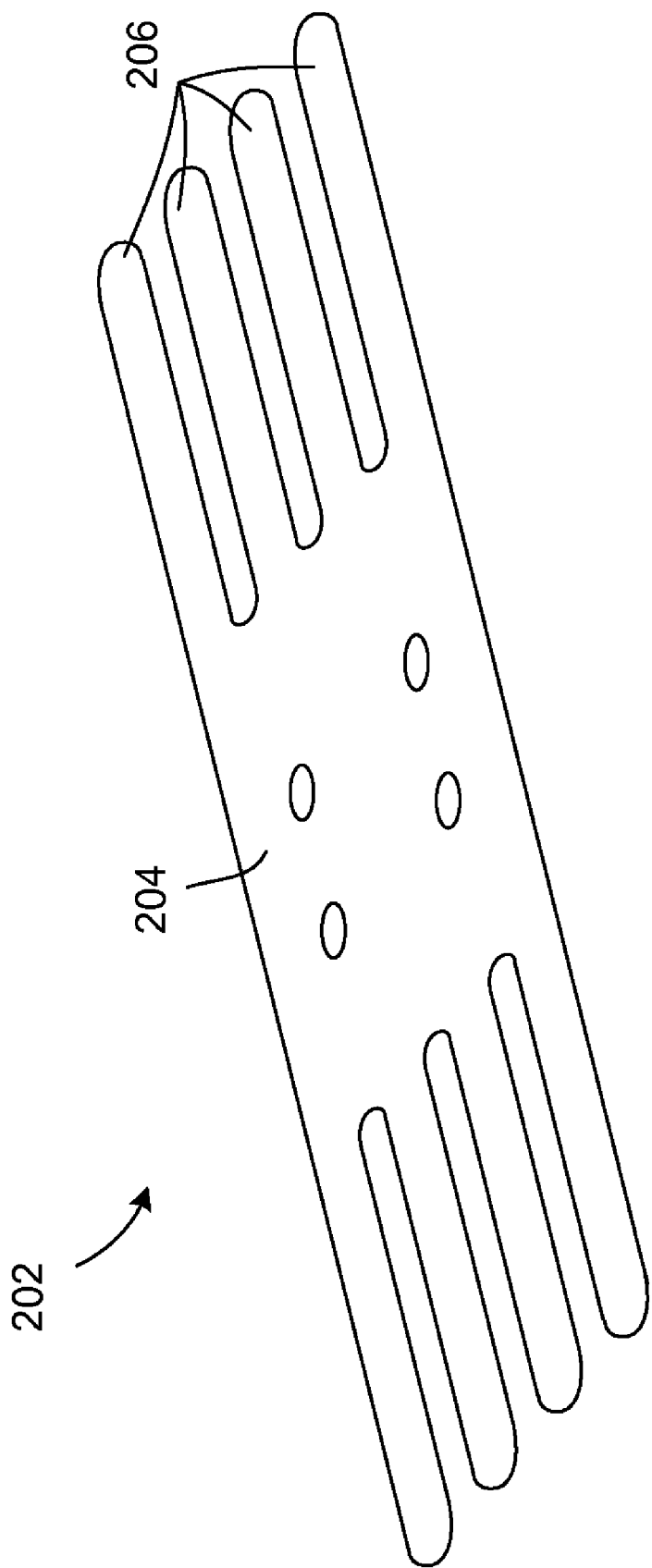
Figure 2C:
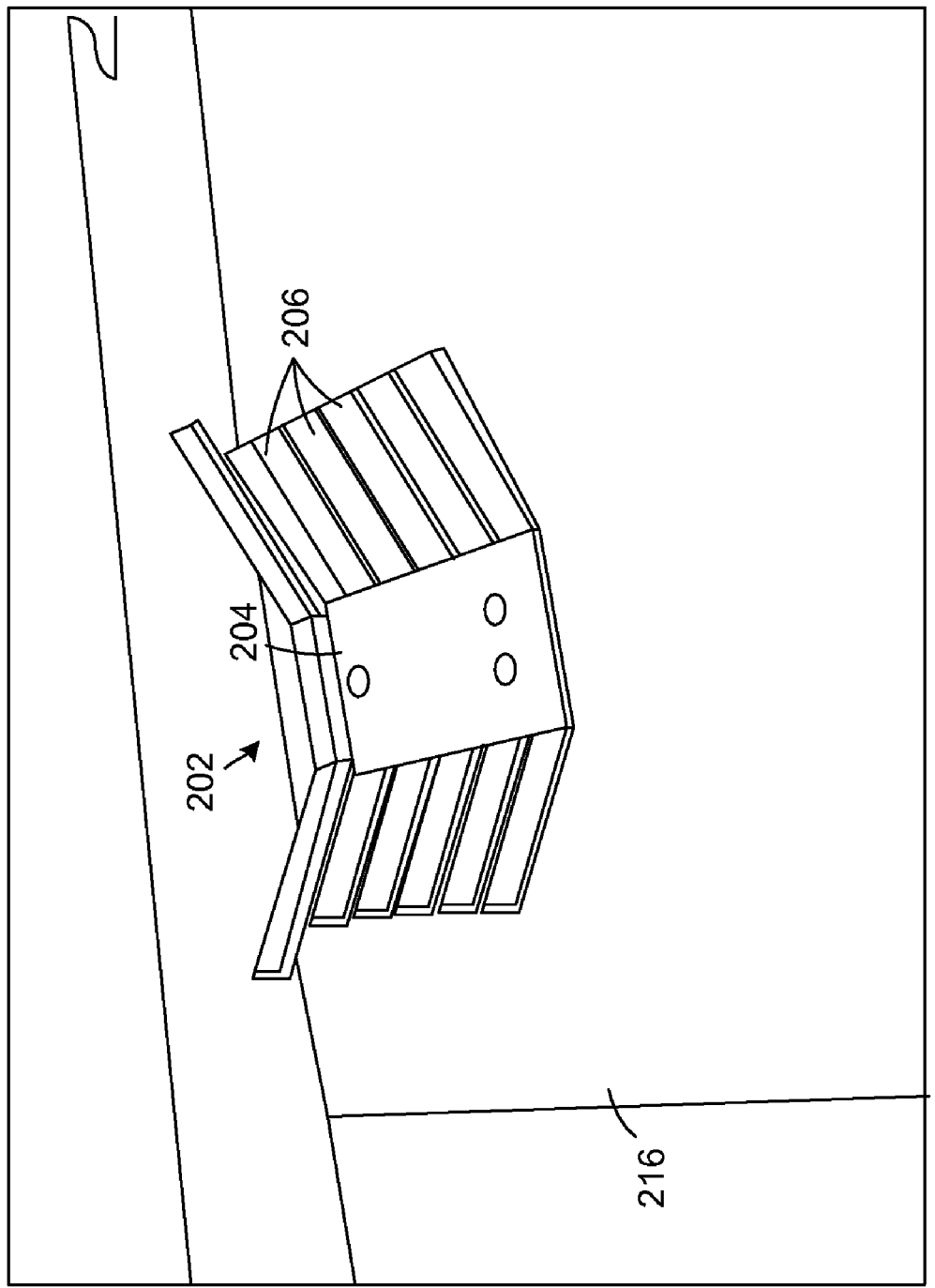
FIG. 2C is a pictorial diagram illustrating a baffle attached to a cover plate in an embodiment of a computer system or server.
Figure 2D:
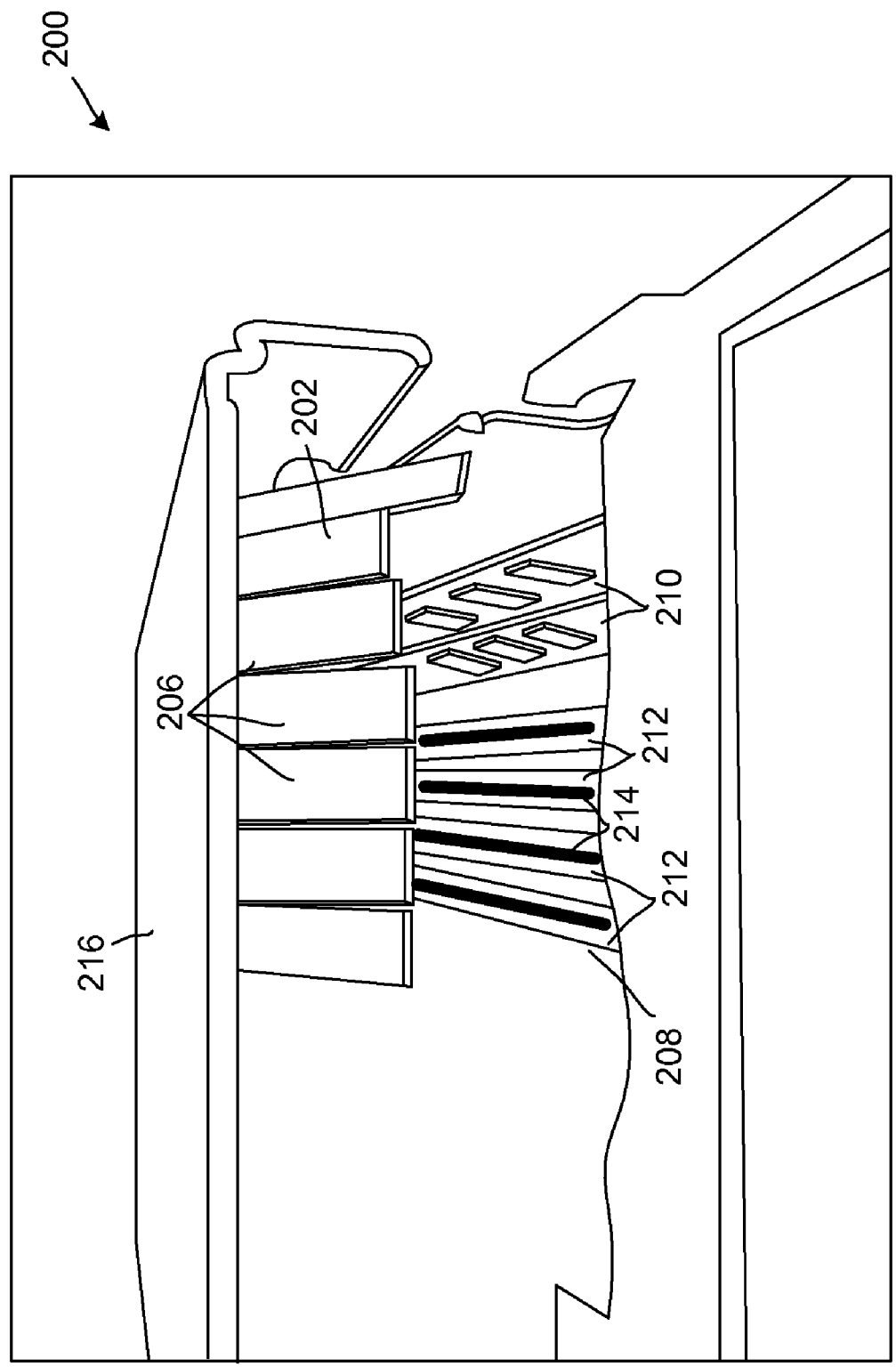
FIG. 2D is a pictorial diagram showing the computer system or server as the cover plate is installed.
Figure 2E:
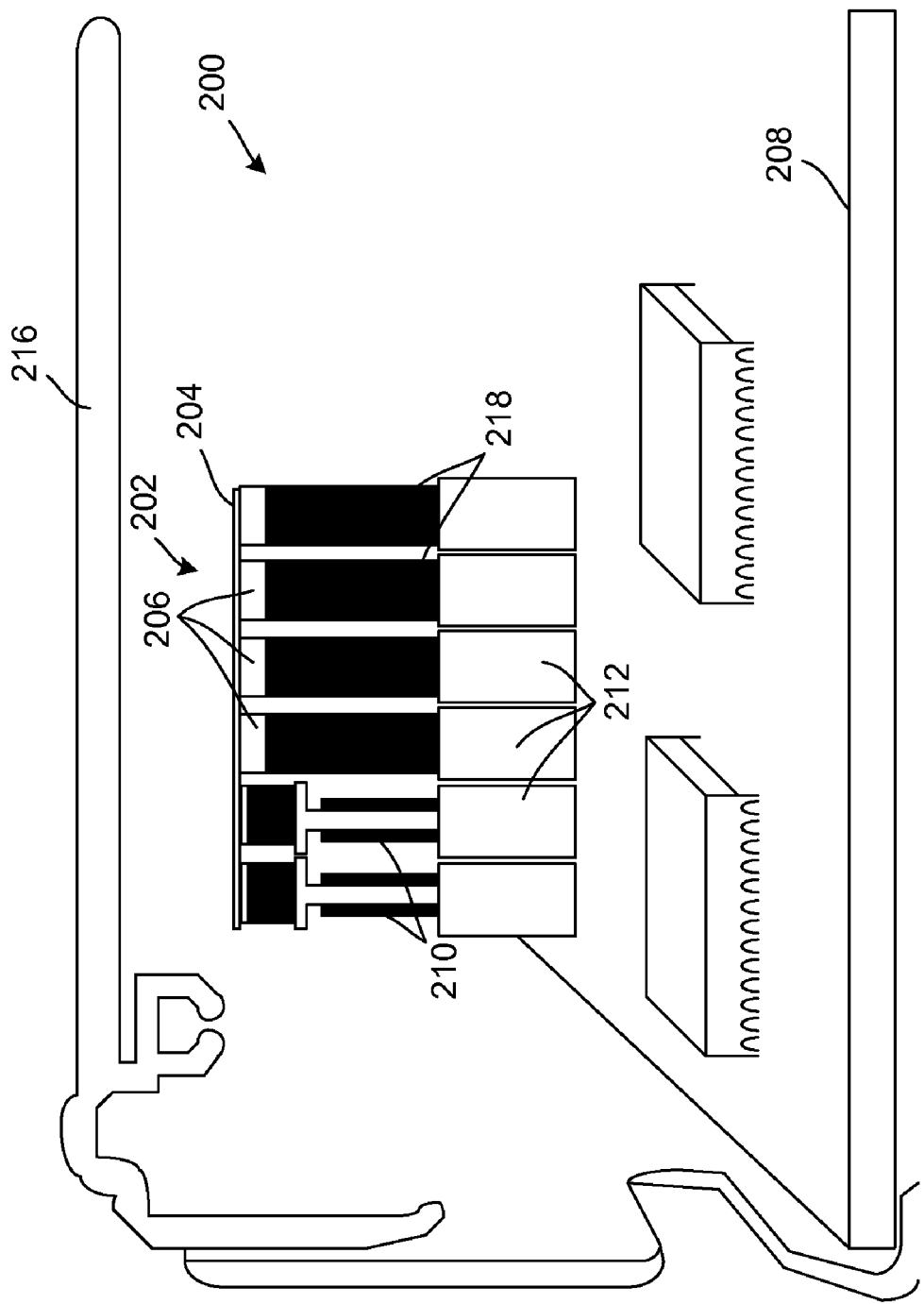
FIG. 2E is a pictorial diagram depicting a side view of the computer system or server once the cover plate is installed.

Referring to FIGS. 2A through 2E, several pictorial diagrams show aspects of an embodiment of a computer system 200. FIGS. 2A and 2B respectively depict an embodiment of a baffle 202 in curved and flattened arrangements. Metal can be flattened 100% to fit in a very small space above the memory section. FIG. 2C illustrates a baffle 202 attached to a cover plate 216 in an embodiment of a computer system or server 200. FIG. 2D shows the computer system or server 200 as the cover plate 216 is installed. FIG. 2E depicts a side view of the computer system or server 200 once the cover plate 216 is installed. The flexible baffle 202 remains extended in areas where no memory is installed while slots 214 with memory devices 210 installed are deflected upward.

An embodiment of the computer system 200 can comprise a printed circuit board 208, and a plurality of memory connectors 212 mounted to the printed circuit board 208. The memory connectors 212 have memory slots 214 into which memory devices 210 such as memory modules, dual in-line memory modules (DIMMs), single in-line memory modules (SIMMs), or individual memory chips can be mounted. The computer system 200 further includes a cover plate 216 that closes over the printed circuit board 208. A baffle 202 couples to the cover plate 216 at a position opposite the memory connectors 212. The baffle 202 can be formed as a baffle plate 204 integral with multiple flexible appendage members 206 lateral to the baffle plate 204. The appendage members 206 are configured in an arrangement that contact empty memory connectors 212 and flexes to contact edges of memory devices 210 installed in the memory connectors 212.

The computer system or server 200 can use the baffle 202 with appendages 206 in a "finger" or other suitable shape that bends or curls downward from above the section of the server 200 in which memory can be installed. The appendage members 206 have a flexible elastic character to function in the manner of a cantilever spring that is attached at the baffle plate 204. The baffle 202 can be formed as a metal plate connected to multiple metal appendage members. In a particular embodiment, the baffle 202 can be formed from a very thin, for example 0.25 mm thickness, stainless steel metal plate. In some implementations, the baffle 202 can be constructed in an integral structure from a single flexible metal sheet which is formed into the metal plate and manipulated or machined to produce the metal appendage members extending from the metal plate.

The baffle 202 can include a protective material coating on at least one surface of the metal plate and the plurality of metal appendage members to prevent the metal appendages from scraping circuit boards or memory devices. The protective coating can be formed of an insulative material such as a paint or plastic. Mylar and formex are examples of suitable insulative plastic materials.

In other embodiments or implementations, the baffle 202 can be constructed from any suitable flexible elastic material. For example, the baffle 202 can be a plastic plate with multiple attached plastic appendage members.

Each memory slot 214 can correspond to multiple restrictive appendage fingers 206 on the baffle 202 to facilitate improvement of flow resistance. When no memory devices are installed the appendages 206 fill the void and create a flow resistance to air that otherwise bypasses through the system 200. Accordingly, the flexible appendage members 206 can include multiple members that oppose a single memory slot 214 and are configured to manage airflow resistance so that the members fill the space left for a memory device in an empty memory connector, thus creating airflow resistance. When memory sockets 214 are filled, the metal appendages 206 contact the top edge of the memory device 210 and deflect upward as memory device 210 places a load on the metal appendage 206 functioning in the manner of a cantilever spring. The deflected appendages 206 can lay flat against the structure of the memory device 210 and allows normal airflow around the memory device 210. Accordingly, the multiple flexible appendage members 206 include members opposed to memory slots 214 and are arranged to manage airflow resistance so that the members 206 are deflected by a memory device 210 installed in a memory slot 214, thereby enabling airflow around the memory device 210.

An added benefit is that the flexible baffle assembly 202 prevents flow from traveling above the memory devices 210, making memory cooling more effective. The baffle 202 can thus be formed to prevent airflow between the cover plate 216 and memory devices 210 installed in the memory slots 214.

The illustrative baffle systems function automatically since the metal or other flexible elastic material baffle is a flat spring that operates well all heights of memory or with no installed memory. The baffle systems function in a repeatable manner in that no moving parts are included. The illustrative systems are low in cost with few parts and easy assembly. The systems save energy, preventing unnecessary fan speed increases which result from hot components that do not receive sufficient airflow when memory slots are empty. The illustrative baffle systems improve thermal performance around the memory by limiting airflow bypassing over the memory and further improve thermal performance by creating miniature "zones" of high speed air that cool neighboring memory.

Figure 3A:
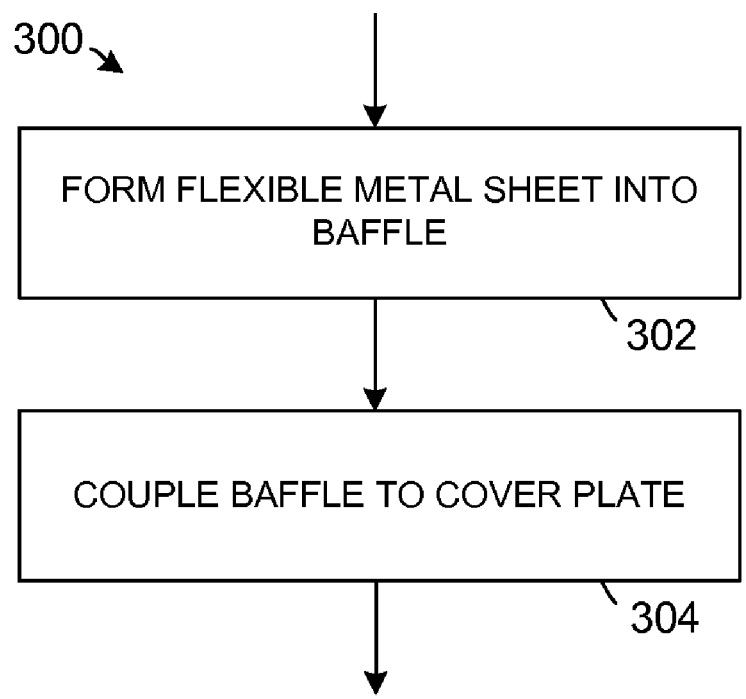
FIG. 3A is a flow chart illustrating an embodiment of operations for manufacturing an electronic assembly that uses a baffle to manage airflow in an electronic system.

Referring to FIG. 3A, a flow chart illustrates an embodiment of operations for manufacturing an electronic assembly that uses a baffle to manage airflow in an electronic system. The illustrative method 300 comprises forming 302 a flexible metal sheet into a baffle comprising a metal plate and a plurality of metal appendage members integral to the metal plate and coupling 304 the baffle to a cover plate that closes opposite a circuit board. Metal appendage members of the baffle extend to contact empty electronic component connectors mounted to the circuit board and flex to accommodate electronic components mounted to electronic component connectors.

Terms "substantially", "essentially", or "approximately", that may be used herein, relate to an industry-accepted tolerance to the corresponding term. Such an industry-accepted tolerance ranges from less than one percent to twenty percent and corresponds to, but is not limited to, functionality, values, process variations, sizes, operating speeds, and the like. The term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. Inferred coupling, for example where one element is coupled to another element by inference, includes direct and indirect coupling between two elements in the same manner as "coupled".

The illustrative block diagrams and flow charts depict process steps or blocks in a manufacturing process. Although the particular examples illustrate specific process steps or acts, many alternative implementations are possible and commonly made by simple design choice. Acts and steps may be executed in different order from the specific description herein, based on considerations of function, purpose, conformance to standard, legacy structure, and the like.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims.

What is claimed is:

1. An electronic assembly comprising:
    multiple mounting means for optionally mounting electronic components; and
    an airflow management means for managing airflow through the optionally mounted electronic components, the airflow management means comprising a main portion; and a plurality of flexible members, each flexible member of the plurality of flexible members extending in a direction away from a side of the main portion, adjacent flexible members of the plurality of flexible members form a pair of flexible members; each adjacent flexible member of the pair of flexible members being formed to extend to be in contact with a corresponding mounting means of the multiple mounting means when the corresponding mounting means is empty, and the each adjacent flexible member of the pair of flexible members flexes to accommodate a particular one of the electronic components when the particular one of the electronic components is mounted to the corresponding mounting means.

2. The assembly according to claim 1 wherein the main portion includes a baffle plate; the flexible member includes a flexible cantilever spring appendage member; the plurality of flexible members includes a plurality of flexible cantilever spring appendage members; and the pair of the flexible members includes a pair of flexible cantilever spring appendage members;
    the assembly further comprising:
    a circuit board;
    wherein the multiple mounting means includes a plurality of electronic connectors mounted to the circuit board, each of the plurality of electronic connectors comprising a slot that accepts the particular one of the electronic components; and
    wherein the airflow management means includes:
    a cover plate that closes opposite the circuit board; and
    a one-piece baffle that couples to the cover plate opposite the plurality of electronic connectors, the baffle comprising the baffle plate coupled to the plurality of flexible cantilever spring appendage members, each flexible cantilever spring appendage members of the plurality of flexible cantilever spring appendage members extending in a direction away from a side of the baffle plate, adjacent flexible cantilever spring appendage member form the pair of flexible cantilever spring appendage members; each adjacent flexible cantilever spring appendage member of the pair of flexible cantilever spring appendage members being formed to extend in a first position to contact with a corresponding electronic connector of the plurality of electronic connectors when the corresponding electronic connector is empty, and the each adjacent flexible cantilever spring appendage member of the pair of flexible cantilever spring appendage members flexes to a second position to accommodate the particular one of the electronic components, when the particular one of the electronic component is installed in the corresponding electronic connector.

3. The assembly according to claim 2 wherein the baffle plate comprises a metal plate;

the plurality of flexible cantilever spring appendage members comprises a plurality of metal flexible cantilever spring appendage members; and an insulative material coating at least one surface of each of the plurality of metal flexible cantilever spring appendage members.

4. The assembly according to claim 3, wherein the baffle plate and the plurality of metal flexible cantilever spring appendage members are formed of stainless steel.

5. The assembly according to claim 2 wherein the baffle plate is formed of a thin metal plate, and the plurality of flexible cantilever spring appendage members are metal flexible cantilever spring appendage members of thickness less than approximately 0.25 millimeters.

6. The assembly according to claim 5, wherein the plurality of metal flexible cantilever spring appendage members are formed of stainless steel.

7. The assembly according to claim 2 further comprising:

the baffle is formed to prevent airflow between the cover plate and each of the electronic components installed in the electronic connector slots.

8. The assembly according to claim 2 further comprising:

the baffle configured for automatic installation wherein seating of the cover plate automatically positions the baffle in correspondence with the plurality of electronic connectors and the electronic components when installed in the plurality of electronic connectors; and the baffle is configured as a single integral sheet wherein the plurality of flexible cantilever spring appendage members are connected to the baffle plate without hinges or connection hardware.

9. The assembly according to claim 2, further comprising a protective material coating at least one surface of each of the plurality of metal flexible cantilever spring appendage members.

10. A computer assembly comprising:

a printed circuit board;

a plurality of memory connectors mounted to the printed circuit board, each of the plurality of memory connectors comprising a memory slot that accepts a memory device;

a cover plate that closes opposite the printed circuit board; and a one-piece baffle that couples to the cover plate opposite the plurality of memory connectors, the baffle comprising a baffle plate coupled to a plurality of flexible appendage members extending in a direction away from a side of the baffle plate, adjacent flexible appendage members of the plurality of flexible appendage members form a pair of flexible appendage members; each adjacent flexible appendage member of the pair of flexible appendage members being formed to extend to contact with a corresponding memory connector of the plurality of memory connectors when the corresponding memory connector is empty and, the each adjacent flexible appendage member of the pair of flexible appendage members flexes to contact a particular memory device installed in the corresponding memory connector when the particular memory device is installed in the corresponding memory connector.

11. The assembly according to claim 10 wherein the baffle plate comprises a metal plate;

the plurality of flexible appendage members comprises a plurality of metal flexible appendage members; and an insulative material coating at least one surface of each of the metal flexible appendage members.

12. The assembly according to claim 11, wherein the baffle plate and the plurality of flexible cantilever spring appendage members are formed of stainless steel.

13. The assembly according to claim 10 wherein the baffle plate is formed of a thin metal plate, and the plurality of flexible appendage members are of thickness less than approximately 0.25 millimeters formed from a flexible metal sheet.

14. The assembly according to claim 10 further comprising:

the baffle is formed to prevent airflow between the cover plate and each of the memory devices installed in the each of the memory slots.

15. The assembly according to claim 10, wherein the baffle plate is formed of a thin metal plate, and the plurality of flexible appendage members are a plurality of metal flexible cantilever spring appendage members.

16. A method for manufacturing an electronic assembly comprising:

forming a flexible metal sheet into a baffle comprising a metal plate and a plurality of metal appendage members integral to the metal plate extending in a direction away from a side of the metal plate, adjacent metal appendage members of the plurality of metal appendage members form pairs of metal appendage members; and coupling the baffle to a cover plate that closes opposite a circuit board, the circuit board comprising a plurality of electronic component connectors mounted to the circuit board, wherein each of the adjacent metal appendage members of each pair of metal appendage members contact a respective electronic component connector of the plurality of electronic component connectors when the respective electronic component connector is empty, and the each of the adjacent metal appendage members of the each pair of the plurality of adjacent metal appendage members flexes to accommodate a particular electronic component mounted to the respective electronic component connector when the particular electronic component is installed in the respective electronic component connector.

* * * * *